(12) United States Patent
Matsumoto et al.

(10) Patent No.: US 10,032,831 B2
(45) Date of Patent: Jul. 24, 2018

(54) ORGANIC EL DISPLAY DEVICE

(71) Applicant: Japan Display Inc., Tokyo (JP)

(72) Inventors: Yuko Matsumoto, Tokyo (JP); Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/614,825

(22) Filed: Jun. 6, 2017

(65) Prior Publication Data

US 2017/0278907 A1 Sep. 28, 2017

Related U.S. Application Data

(63) Continuation of application No. PCT/JP2015/083076, filed on Nov. 25, 2015.

(30) Foreign Application Priority Data

Dec. 18, 2014 (JP) .................. 2014-255901

(51) Int. Cl.
*H01L 27/32* (2006.01)
*H01L 51/52* (2006.01)
(Continued)

(52) U.S. Cl.
CPC ...... *H01L 27/3218* (2013.01); *H01L 27/3216* (2013.01); *H01L 27/3246* (2013.01);
(Continued)

(58) Field of Classification Search
CPC ............. H01L 27/3218; H01L 27/3246; H01L 27/3262; H01L 27/3216; H01L 51/56;
(Continued)

(56) References Cited

U.S. PATENT DOCUMENTS

| | | | |
|---|---|---|---|
| 2010/0044690 A1* | 2/2010 | Okutani | ............. H01L 27/3211 257/40 |
| 2013/0328039 A1* | 12/2013 | Ohuchi | ............. H01L 27/3244 257/40 |

(Continued)

FOREIGN PATENT DOCUMENTS

| JP | 2010-182422 A | 8/2010 |
|---|---|---|
| JP | 2012-160388 A | 8/2012 |

(Continued)

OTHER PUBLICATIONS

Partial English Translation of Written Opinion of the International Search Authority dated Mar. 1, 2016 for PCT Application No. PCT/JP2015/083076.

(Continued)

*Primary Examiner* — Roy Potter
*Assistant Examiner* — Paul Patton
(74) *Attorney, Agent, or Firm* — Typha IP LLC

(57) ABSTRACT

A display device preventing light leak to an adjacent pixel and thus to prevent color mixing to improve image quality is provided. An organic EL display device includes a plurality of pixels. The plurality of pixels each include a light emitting element; the light emitting element includes a pixel electrode, a common electrode, an EL common layer, and a light emitting layer; the EL common layer and the light emitting layer are provided between the pixel electrode and the common electrode; the EL common layer covers a main surface and an end of the pixel electrode; the pixel electrode is provided on an insulating layer; and the common electrode is in contact with the insulating layer between the plurality of pixels.

19 Claims, 18 Drawing Sheets

(51) Int. Cl.
  *H01L 51/56* (2006.01)
  *H01L 51/00* (2006.01)
  *H01L 51/50* (2006.01)

(52) U.S. Cl.
  CPC ...... *H01L 27/3248* (2013.01); *H01L 27/3262* (2013.01); *H01L 51/0005* (2013.01); *H01L 51/5209* (2013.01); *H01L 51/56* (2013.01); *H01L 51/5012* (2013.01); *H01L 2227/323* (2013.01)

(58) Field of Classification Search
  CPC ............. H01L 51/5209; H01L 27/3248; H01L 51/0005; H01L 51/5012; H01L 2227/323
  See application file for complete search history.

(56) References Cited

U.S. PATENT DOCUMENTS

| | | | |
|---|---|---|---|
| 2013/0329039 A1 | 12/2013 | Sakai | |
| 2014/0131692 A1* | 5/2014 | Mishima | H01L 51/5088 257/40 |
| 2014/0312337 A1* | 10/2014 | Isobe | H01L 51/5231 257/40 |
| 2015/0008414 A1 | 1/2015 | Isobe | |
| 2016/0141551 A1* | 5/2016 | Seo | H01L 51/5253 257/40 |

FOREIGN PATENT DOCUMENTS

| | | |
|---|---|---|
| WO | 2012/114403 A1 | 8/2012 |
| WO | 2013/076948 A1 | 5/2013 |
| WO | 2013/118462 A1 | 8/2013 |
| WO | 2013/179361 A1 | 12/2013 |

OTHER PUBLICATIONS

International Search Report dated Mar. 1, 2016 for PCT Application No. PCT/JP2015/083076 with partial translation.
Written Opinion of the International Search Authority dated Mar. 1, 2016 for PCT Application No. PCT/JP2015/083076.
Japanese Office Action dated Mar. 27, 2018 for corresponding Japanese Patent Application No. 2014-255901 with partial translation.

\* cited by examiner

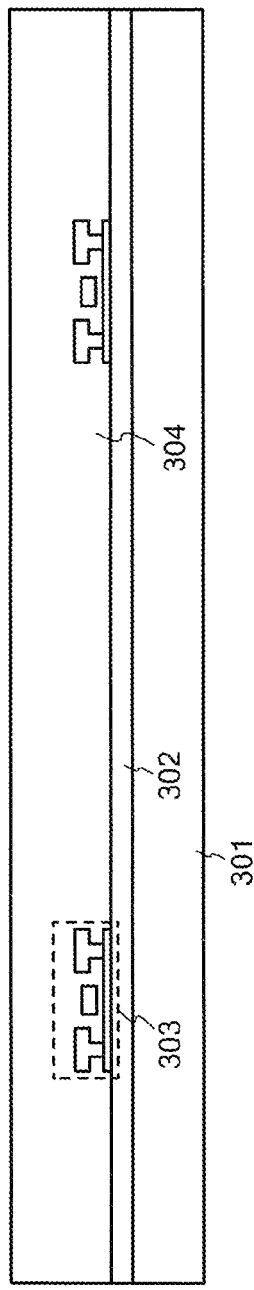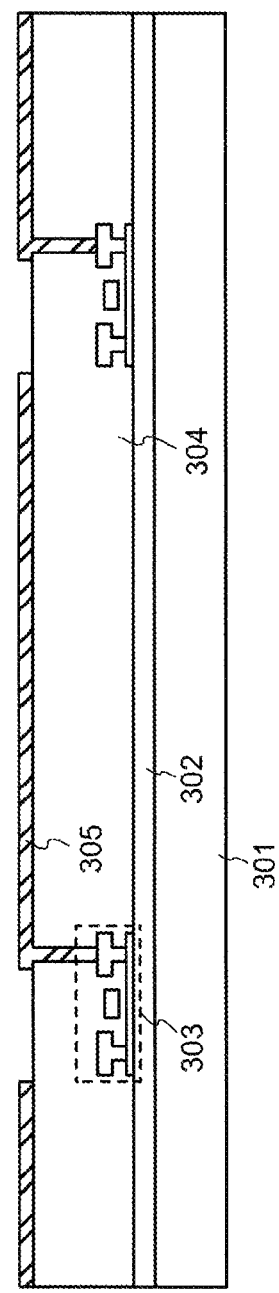

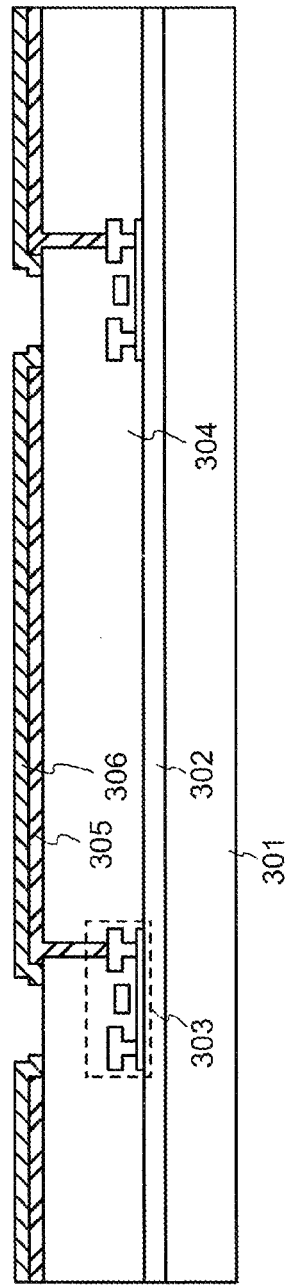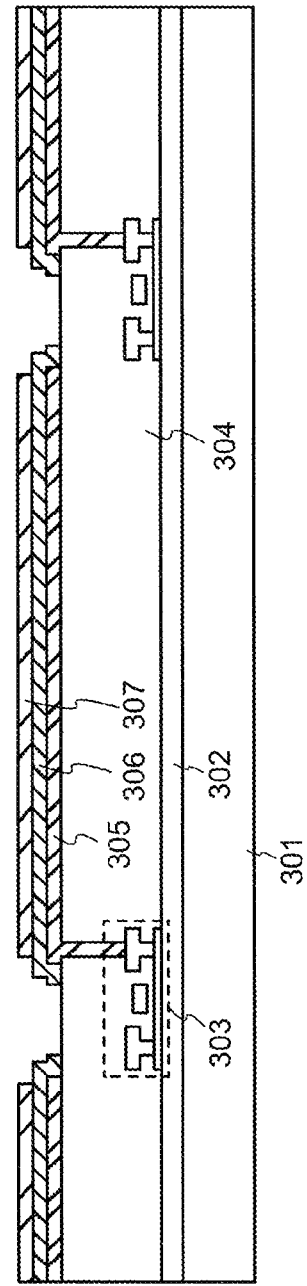

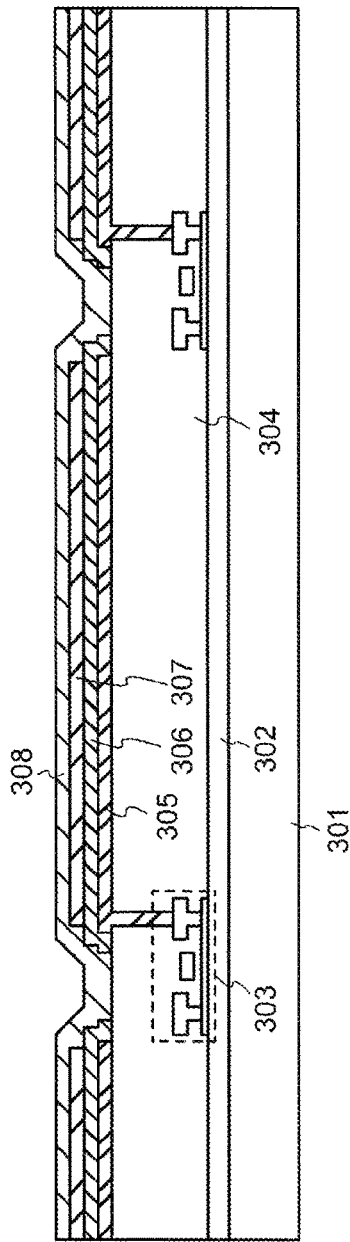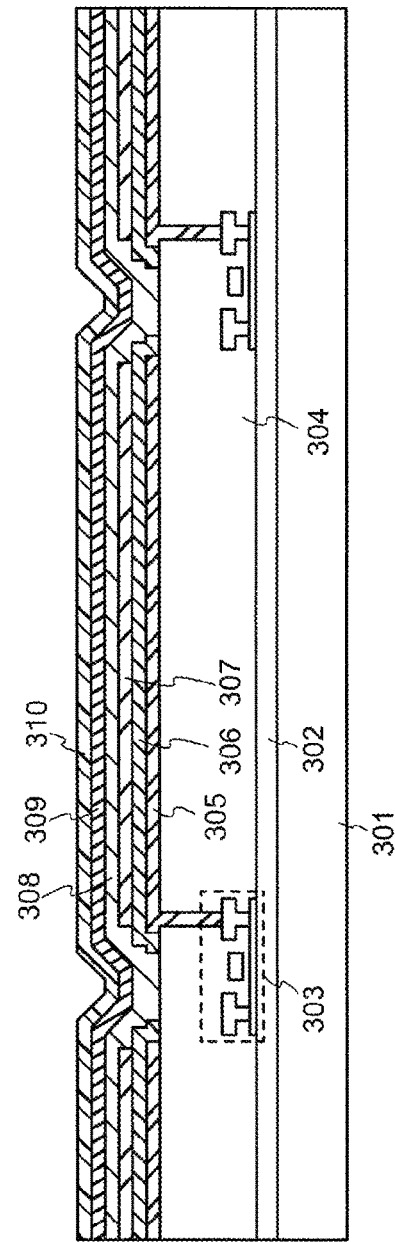

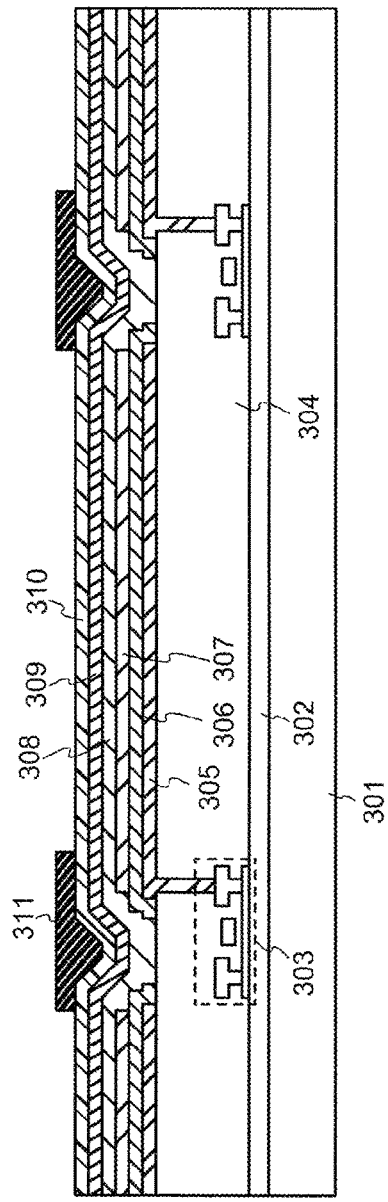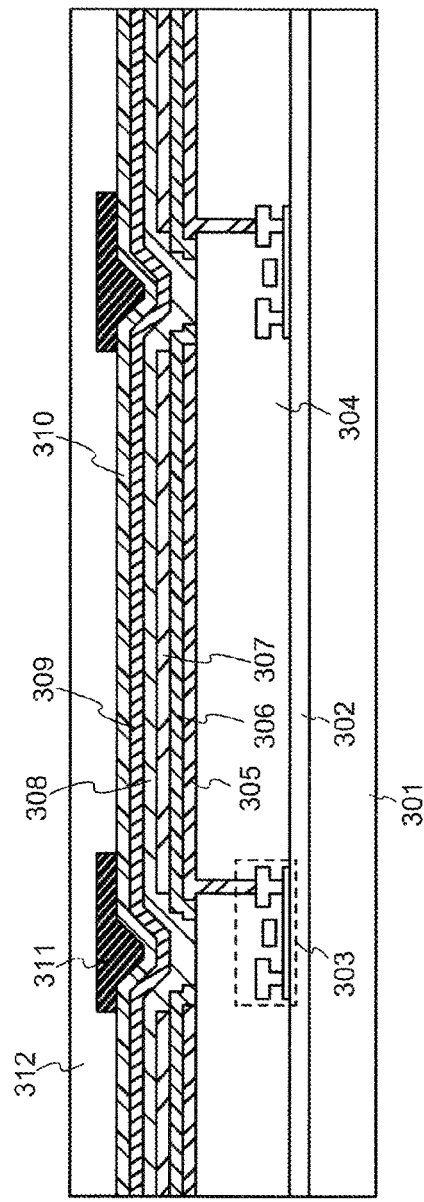

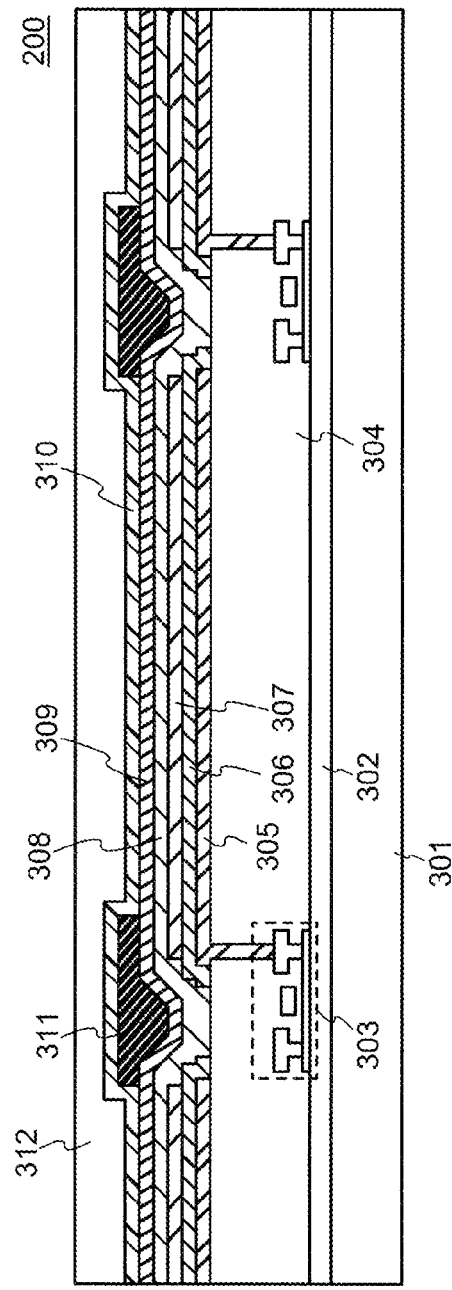

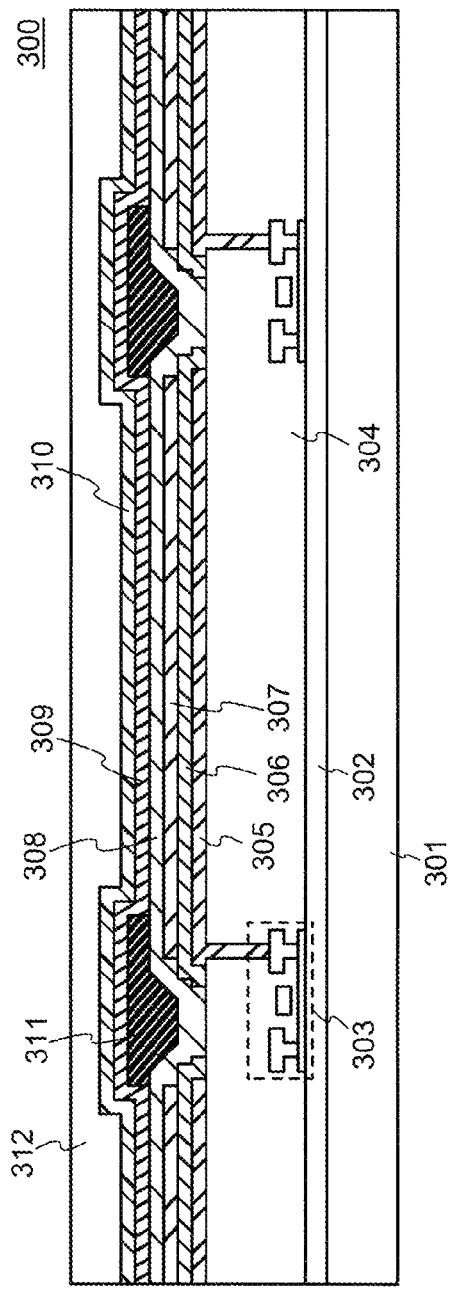

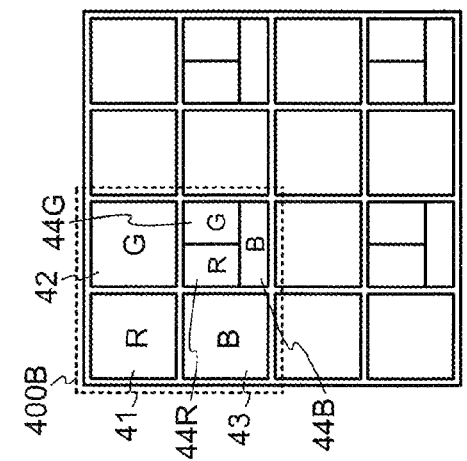
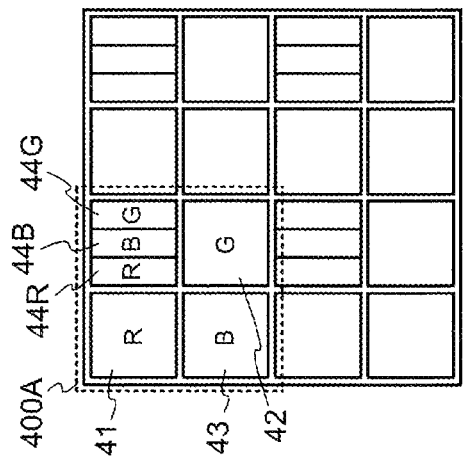

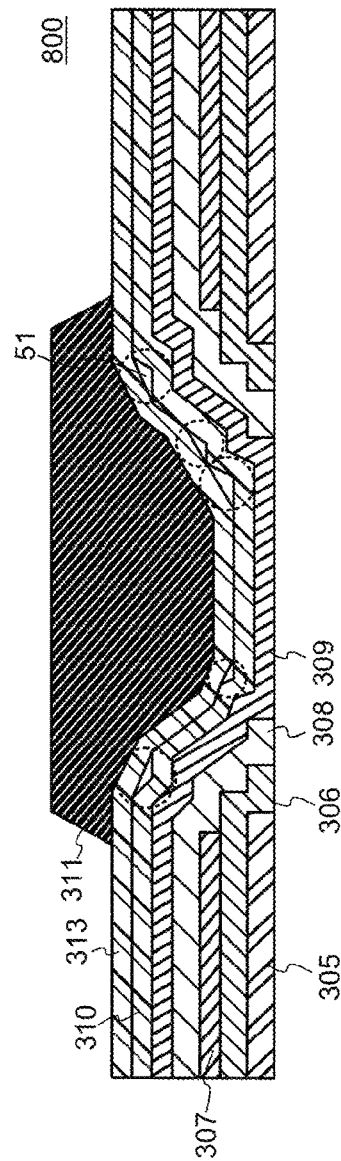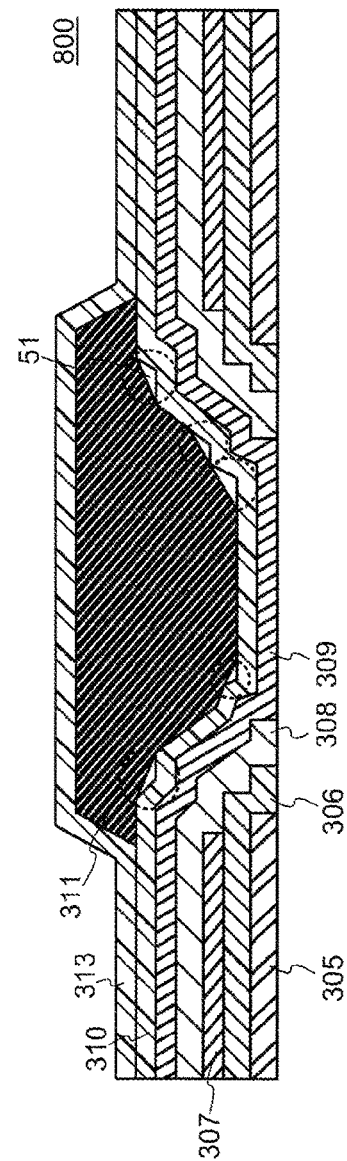

ORGANIC EL DISPLAY DEVICE

CROSS REFERENCE TO RELATED APPLICATIONS

This application is based upon and claims the benefit of priority from the prior Japanese Patent Application No. 2014-255901, filed on Dec. 18, 2014, and PCT Application No. PCT/JP2015/083076 filed on Nov. 25, 2015, the entire contents of which are incorporated herein by reference.

FIELD

The present invention relates to a display device including pixels each including a light emitting element such as an electroluminescence element or the like, and specifically to an organic EL display device using an organic EL material as a light emitting material.

BACKGROUND

As a light emitting element using an electroluminescence (EL) phenomenon, an electroluminescence (hereinafter, referred to also as "EL") element is known. An EL element is capable of emitting light of any of various colors, namely, light of any of various wavelengths by selecting a light emitting material to be contained in a light emitting layer. Such an EL element is now progressively applied to display devices and illumination devices. Especially, an organic EL element using an organic material as the light emitting material is now a target of attention.

An organic EL display device including an organic EL element for display includes a substrate and pixels located in a matrix on the substrate, and each of the pixels includes an organic EL element as a light emitting element and a switching element controlling the light emission of the light emitting element. The organic EL display device controls the switching device of each pixel to be on or off to display any image on the entirety of a display region.

In a common organic EL display device, pixel electrodes are each enclosed by an insulating material such as a resin or the like provided along a periphery of the pixel electrode. Thus, each of the pixel electrodes is demarcated, and a light emitting element is formed in the enclosed area (Japanese Laid-Open Patent Publication No. 2012-160388).

Such an enclosing portion formed of an insulating material is generally referred to as a bank. A bank flattens the roughness caused by contact holes formed to connect the pixel electrodes and the switching elements to each other or prevents shortcircuiting from occurring between the pixel electrodes included in EL elements and a common electrode. In the case where the light emitting layer is formed by a printing method, the bank acts as a wall demarcating the printing area.

SUMMARY

An embodiment according to the present invention is directed to an organic EL display device includes a plurality of pixels. The plurality of pixels each include a light emitting element; the light emitting element includes a pixel electrode, a common electrode, an EL common layer, and a light emitting layer; the EL common layer and the light emitting layer are provided between the pixel electrode and the common electrode; the EL common layer covers a main surface and an end of the pixel electrode; the pixel electrode is provided on an insulating layer; and the common electrode is in contact with the insulating layer between the plurality of pixels.

An embodiment according to the present invention is directed to a method for producing an organic EL display device including a plurality of pixels. The method includes forming a pixel electrode at a position corresponding to each of the plurality of pixels on an insulating layer on a substrate; forming a stack structure including an EL common layer and a light emitting layer on the pixel electrode; and forming a common electrode covering the stack structure and contacting the insulating layer between the plurality of pixels. The EL common layer is formed so as to cover a main surface and an end of the pixel electrode.

BRIEF EXPLANATION OF DRAWINGS

FIG. 4A shows a method for producing the pixel portion of the organic EL display device in embodiment 1 according to the present invention;

FIG. 4B shows the method for producing the pixel portion of the organic EL display device in embodiment 1 according to the present invention;

FIG. 5A shows the method for producing the pixel portion of the organic EL display device in embodiment 1 according to the present invention;

FIG. 5B shows the method for producing the pixel portion of the organic EL display device in embodiment 1 according to the present invention;

FIG. 6A shows the method for producing the pixel portion of the organic EL display device in embodiment 1 according to the present invention;

FIG. 6B shows the method for producing the pixel portion of the organic EL display device in embodiment 1 according to the present invention;

FIG. 7A shows the method for producing the pixel portion of the organic EL display device in embodiment 1 according to the present invention;

FIG. 7B shows the method for producing the pixel portion of the organic EL display device in embodiment 1 according to the present invention;

FIG. 8 is a cross-sectional view showing a schematic structure of a pixel portion of an organic EL display device in embodiment 2 according to the present invention;

FIG. 9 is a cross-sectional view showing a schematic structure of a pixel portion of an organic EL display device in embodiment 3 according to the present invention;

FIG. 14A is a plan view showing a schematic structure of the pixel portion of the organic EL display device in embodiment 7 according to the present invention;

FIG. 14B is a plan view showing a schematic structure of the pixel portion of the organic EL display device in embodiment 7 according to the present invention;

FIG. 15A is a cross-sectional view showing a schematic structure of a pixel portion of an organic EL display device in embodiment 8 according to the present invention;

FIG. 15B is a cross-sectional view showing a schematic structure of the pixel portion of the organic EL display device in embodiment 8 according to the present invention;

DESCRIPTION OF EMBODIMENTS

Figure 1:
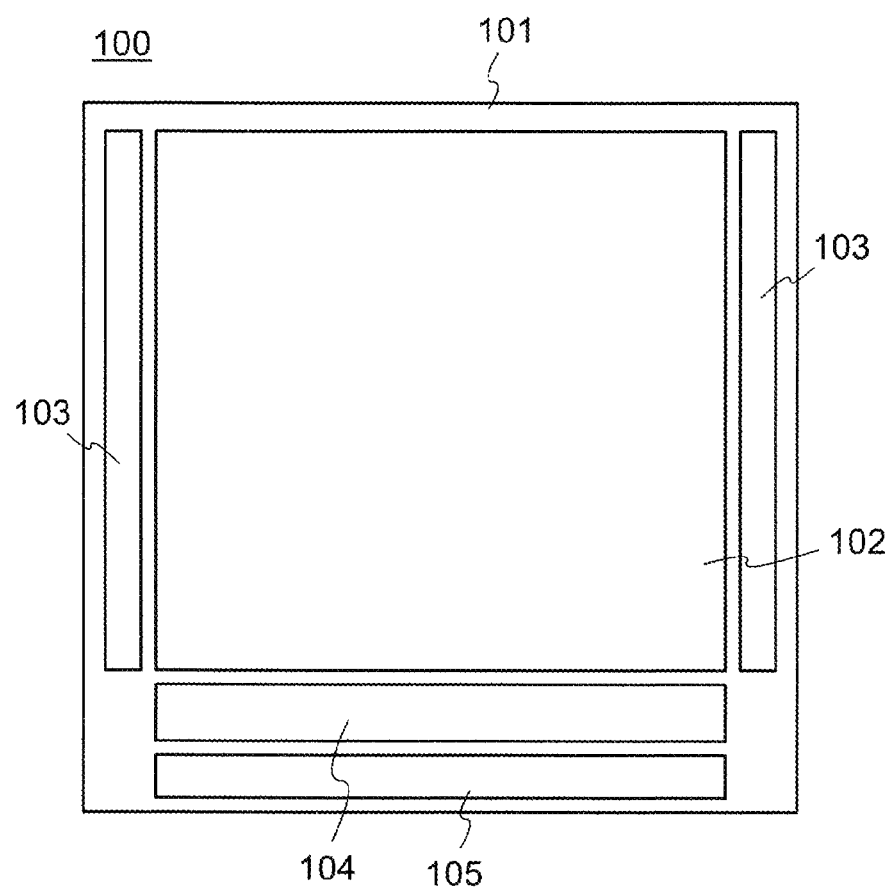
FIG. 1 is a plan view showing a schematic structure of an organic EL display device in embodiment 1 according to the present invention.

In order to form a bank, a desired pattern needs to be formed by photolithography after an insulating film is formed. Therefore, the formation of the bank requires a plurality of steps including an insulating material application step, a baking step, an exposure step, a developing step and the like.

In general, a side surface of a bank is tapered in order to prevent a situation where the light emitting layer is physically divided and the divided portions are made electrically nonconductive. Therefore, the bank and the pixel electrode may occasionally overlap each other along a length of 3 μm or longer. This prevents increase in the numerical aperture and thus is not desirable to provide higher definition display.

The present invention has an object of flattening a surface of a pixel electrode having a contact hole with no use of a bank.

The present invention has another object of preventing shortcircuiting from occurring between the pixel electrode included in an EL element and a common electrode with no use of a bank.

Hereinafter, embodiments of the present invention will be described with reference to the drawings or the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

(Embodiment 1)
<Structure of the Display Device>

FIG. 1 is a plan view showing a schematic structure of an organic EL display device 100 in embodiment 1 according to the present invention. The organic EL display device 100 includes a substrate 101, a pixel portion (display region) 102, a scanning line driving circuit 103, a data line driving circuit 104, and a driver IC 105. The pixel portion 102, the scanning line driving circuit 103, the data line driving circuit 104, and the driver IC 105 are provided on the substrate 101. The organic EL display device 100 may also include an FPC (Flexible Printed Circuit) supplying a signal to the scanning line driving circuit 103 and the data line driving circuit 104.

The pixel portion 102 shown in FIG. 1 includes a plurality of pixels 201 (FIG. 2) arrayed in a matrix. Each of the pixels 201 is supplied with a data signal in accordance with image data from the data line driving circuit 104. The data signal is supplied to a pixel electrode via a transistor included in each pixel 201, so that an image in accordance with the image data is displayed. A transistor may typically be a thin film transistor. The transistor is not limited to a thin film transistor, and may be any element having an electric current control function.

Figure 2:
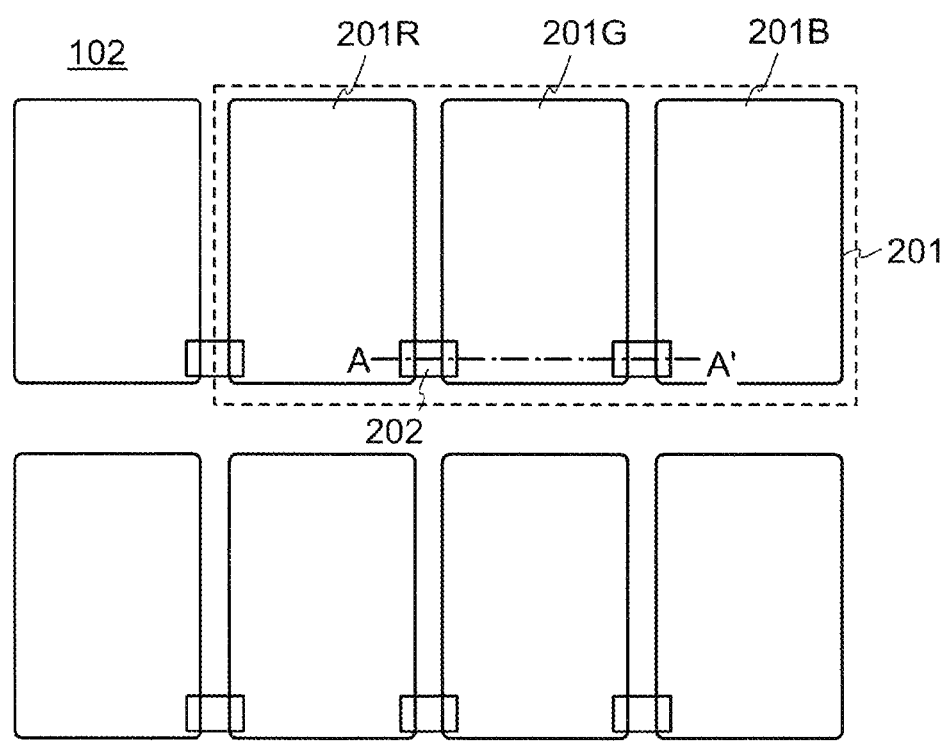
FIG. 2 is a plan view showing a schematic structure of a pixel portion of the organic EL display device in embodiment 1 according to the present invention.

FIG. 2 is a plan view showing a schematic structure of the pixel portion 102 in the organic EL display device 100. In this embodiment, the pixels 201 each include a sub pixel 201R corresponding to red (R), a sub pixel 201G corresponding to green (G), and a sub pixel 201B corresponding to blue (B). Each sub pixel includes a thin film transistor 202. The sub pixels 201R, 201G and 201B are each controlled to be on or off by use of the thin film transistor 202, so that light of a color corresponding to the respective sub pixel is emitted. Thus, each pixel provides any of various colors.

In the example shown in FIG. 2, the sub pixels correspond to the three primary colors, namely, the RGB colors. This embodiment is not limited to this, and the pixel 201 may include four sub pixels including a sub pixel corresponding to white (W) or a sub pixel corresponding to yellow (Y) in addition to the sub pixels corresponding to the RGB colors. In the example shown in FIG. 2, the sub pixels corresponding to the same color are arrayed in one line, so that the sub pixels of different colors are arrayed in stripes (stripe arrangement). Alternatively, a delta arrangement, a Bayer arrangement, or a Pen Tile arrangement may be used.

Figure 3:
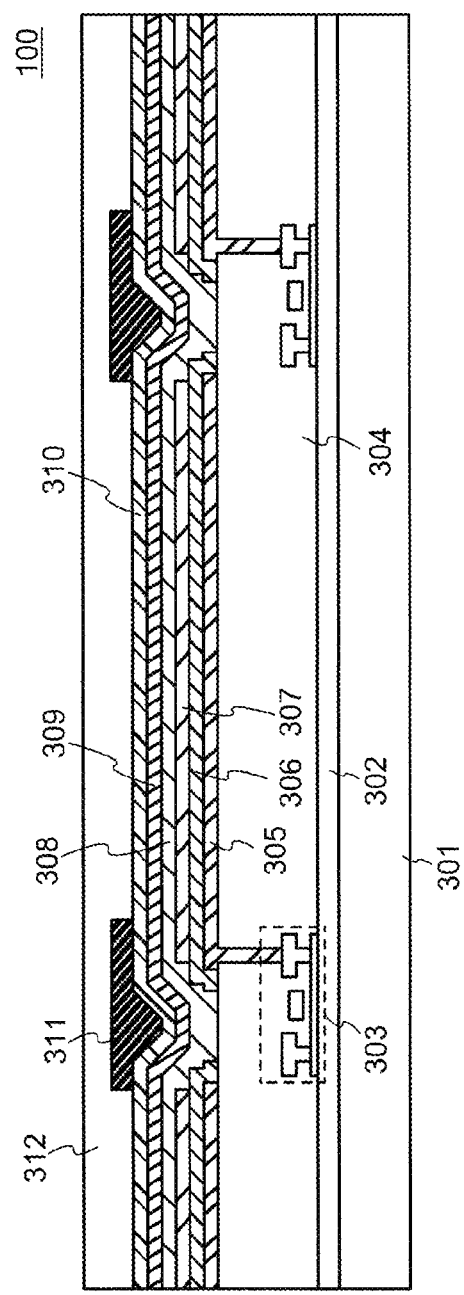
FIG. 3 is a cross-sectional view showing a schematic structure of the pixel portion of the organic EL display device in embodiment 1 according to the present invention.

FIG. 3 is a cross-sectional view showing a schematic structure of the pixel 201 taken along line A-A' in FIG. 2. As shown in FIG. 3, the organic EL display device includes a substrate 301, an underlying layer 302 provided on the substrate 301 and formed of an inorganic insulating material such as silicon oxide, silicon nitride, aluminum oxide or the like, and a thin film transistor 303 provided on the underlying layer 302.

The substrate 301 may be a glass substrate, a quartz substrate, or a flexible substrate (bendable substrate formed of polyimide, polyethyleneterephthalate, polyethylenenaphthalate, etc.). In the case where the substrate 301 does not need to be light-transmissive, the substrate 301 may be a metal substrate, a ceramic substrate, a semiconductor substrate or the like.

The thin film transistor 303 may be formed by a known method. The thin film transistor 303 may be of a top gate type or a bottom gate type. The organic EL display device 100 in this embodiment includes a first insulating layer 304 provided so as to cover the thin film transistor 303. Thus, the roughness caused by the formation of the thin film transistor 303 is flattened. The first insulating layer 304 is preferably formed of a resin material. The first insulating layer 304 may be formed of an organic material such as polyimide, polyamide, acrylic resin or the like. Alternatively, the first insulating layer 304 may be formed of an inorganic material such as silicon oxide or the like. Still alternatively, the first insulating layer 304 may have a stack structure including a bottom layer formed of an inorganic material such as silicon oxide, silicon nitride or the like and a top layer formed of an organic material such as polyimide, polyamide, acrylic resin or the like.

The organic EL display device 100 includes a pixel electrode 305 provided on the first insulating layer 304. The pixel electrode 305 is connected with the thin film transistor 303 via a contact hole formed in the first insulating layer 304. In the organic EL display device 100 in this embodiment, the pixel electrode 305 acts as an anode of an organic EL element.

The pixel electrode 305 has a different structure depending on whether light emitted from the organic EL element is output upward (direction in which the light is not transmitted through the first insulating layer 304) or downward (direction in which the light is transmitted through the first insulating layer 304). In the case where, for example, the light is output upward, the pixel electrode 305 may be formed of a metal film having a high reflectance or may have a stack structure including a transparent conductive film having a high work function such as an indium oxide-based transparent conductive film, a zinc oxide transparent conductive film or the like, and a metal film. By contrast, in the case where the light is output downward, the pixel electrode 305 may be formed of a single transparent conductive film.

The organic EL display device 100 includes a first EL common layer 306 provided on the pixel electrode 305. The first EL common layer 306 is a functional layer having a function of assisting holes in transferring from the pixel electrode 305 to a light emitting layer 307 (described below). Specifically, the first EL common layer 306 may be a known hole injection layer or a known hole transfer layer, or may have a stack structure including both of a known hole injection layer and a known hole transfer layer. Known materials usable for the hole injection layer include an aromatic amine derivative, a polyaniline derivative, a polythiophene derivative, a phenylamine derivative, and the like. Known materials usable for the hole transfer layer include PEDOT/PSS, and the like.

In the organic EL display device 100 in this embodiment, the first EL common layer 306 is provided so as to cover a main surface and an end of the pixel electrode 305. The "main surface of the pixel electrode" is a surface of the pixel electrode that faces the light emitting layer 307. The "end of the pixel electrode" is a portion of the pixel electrode that is an edge when the pixel electrode is seen in a plan view. As shown in FIG. 3, in the organic EL display device 100 in this embodiment, the first EL common layer 306 is provided so as to cover the exposed portion of the pixel electrode 305.

The pixel electrode 305 is covered with the first EL common layer 306 with a sufficient thickness. Thus, the pixel electrode 305 and a common electrode 309 (described below) are prevented from being shortcircuited from each other.

As described in another embodiment below, a recessed portion caused by the formation of the contact hole in which the pixel electrode 305 and the thin film transistor 303 are connected with each other may be filled with the first EL common layer 306. Thus, the main surface of the pixel electrode 305 having the recessed portion is flattened by the first EL common layer 306. Since the main surface of the pixel electrode 305 having the recessed portion is flattened in this manner, the light emitting layer 307 and a second EL common layer 308 provided on the first EL common layer 306 are also flattened, and thus a leak or shortcircuiting is suppressed from occurring between the pixel electrode 305 and the common electrode 309.

As described below, in this embodiment, the first EL common electrode 306 is formed by a liquid droplet ejection method (e.g., inkjet method) of an electrostatic system.

The organic EL display device 100 includes the light emitting layer 307 provided on the first EL common layer 306. The light emitting layer 307 is a functional layer that emits light by an energy generated when holes and electrons are recombined. The light emitting layer 307 may be formed of a known organic light emitting material. Known materials usable for the light emitting layer 307 include a polyphenylene derivative, a polyfluorene derivative, a paraphenylenevinylene derivative, a polythiophene derivative, and the like. The light emitting layer 307 may contain, as an additive, an appropriate organic material in order to provide the light emitted by such an organic light emitting material with a color of RGB colors. Examples of the materials usable as such an additive include an organic material such as DCM, rhodamine, Nile red or the like for a red color, an organic material such as coumarin, quinacridone or the like for a green color, and an organic material such as perylene, tetraphenylbutadiene or the like for a blue color.

In the EL display device 100 in this embodiment, a conventional bank structure is not adopted. Therefore, the area of the pixel electrode 305 is fully utilized to form an organic EL element. For example, the light emitting layer 307 and the pixel electrode 305 may be located to overlap each other in substantially the entire areas thereof, so that the entirety of the pixel electrode 305 is used as an anode of the organic EL element.

However, at the end of the pixel electrode 305, the first EL common electrode 306 and the light emitting layer 307 are likely to be non-uniform in the thickness, and thus an electric field is likely to be disturbed. Therefore, it is preferable that the light emitting layer 307 is controlled such that an end thereof is located inner to the end of the pixel electrode 305 by a length of 0.5 to 1.5 μm. In this embodiment, the light emitting layer 307 is formed by the liquid droplet ejection method of the electrostatic system, like the first EL common electrode 306. Therefore, the position control is performed highly precisely. Needless to say, the end of the light emitting layer 307 may be located outer to the end of the pixel electrode 305.

The organic EL display device 100 includes the second EL common layer 308 provided on the light emitting layer 307. The second EL common layer 308 is a functional layer having a function of assisting electrons in transferring from the common electrode 309 adjacent thereto to the light emitting layer 307. Specifically, the second EL common layer 308 may be a known electron injection layer or a known electron transfer layer, or may have a stack structure including both of a known electron injection layer and a known electron transfer layer. Known materials usable for the electron injection layer include a metal fluoride such as LiF or the like. Known materials usable for the electron transfer layer include a triazine derivative.

In the organic EL display device 100 in this embodiment, the second EL common layer 308 is commonly provided for a plurality of pixels. Alternatively, a second EL common layer 308 may be provided for each of the plurality of pixels. Still alternatively, the second EL common layer 308 may be omitted.

The organic EL display device 100 includes the common electrode 309 provided on the second EL common layer 308. In the organic EL display device 100 in this embodiment, the common electrode 309 acts as a cathode of the organic EL element.

The common electrode 309 has a different structure depending on whether light emitted from the organic EL element is output upward (direction in which the light is not transmitted through the first insulating layer 304) or downward (direction in which the light is transmitted through the first insulating layer 304). In the case where, for example, the light is output upward, the common electrode 309 may be formed of an indium oxide-based transparent conductive film, a zinc oxide transparent conductive film or the like. Alternatively, the common electrode 309 may be formed of a metal film having a low work function such as an MgAg alloy film or the like as long as the metal film has a thickness of about 5 to 30 nm with which the light is transmitted. By contrast, in the case where the light is output downward, the common electrode 309 may be formed of a metal film such as an MgAg alloy film or the like that has a thickness sufficiently large to allow the light to be reflected (about ten times the above-described thickness, namely, about 50 to 300 nm).

The organic EL display device 100 includes a second insulating layer 310 provided on the common electrode 309. The second insulating layer 310 acts as a sealing film preventing entrance of moisture or a contaminant from outside. The second insulating layer 310 is preferably an insulating layer having a fine film quality formed of a silicon nitride-based material or an aluminum oxide-based material. Alternatively, the second insulating layer 310 may have a stack structure including a silicon nitride-based insulating layer and a resin layer.

The organic EL display device 100 includes a black mask 311 provided on the second insulating layer 310. In the organic EL display device 100 in this embodiment, the black mask 311 is formed of a resin layer containing carbon black (black pigment) dispersed therein. The black mask 311 is not limited to this, and may be formed of any conductive layer acting as a light-blocking layer.

The organic EL display device 100 includes a third insulating layer 312 provided on the black mask 311. The third insulating layer 312 acts as a protective layer protecting the organic EL element and the other components provided on the substrate 301. The third insulating layer 312 may be a resin layer formed of polyimide, acrylic resin or the like. Alternatively, the third insulating layer 312 may be an inorganic insulating layer formed of silicon oxide or the like.

Although not shown in FIG. 3, the organic EL display device 100 may further include a polarization plate or a touch panel provided on the third insulating layer 312. In this case, the third insulating layer 312 also protects the organic EL element and the other components against an external mechanical factor (e.g., pressure of pressing the touch panel) or the like. The organic EL display device 100 may further include a color filter provided on the third insulating layer 312 optionally.

As described above, in the organic EL display device 100 in this embodiment, the main surface and the end of the pixel electrode 305 are covered with the first EL common layer 306. Such a structure allows the end of the pixel electrode 305 to be covered with the first EL common layer 306 having a sufficient thickness with no use of a bank, and thus prevents shortcircuiting from occurring between the pixel electrode 305 of the EL element and the common electrode 309.

The recessed portion formed at the pixel electrode 305 by the formation of the contact hole may be filled with the first EL common layer 306. Therefore, the surface of the pixel electrode 305 having the contact hole is flattened with no use of a bank.

A method for producing the organic EL display device 100 having the above-described structure will be described with reference to FIG. 4A through FIG. 7B.

<Method for Producing the Display Device>

First, as shown in FIG. 4A, the underlying layer 302 is formed on the substrate 301, and the thin film transistor (TFT) 303 is formed thereon by a known method. Then, the first insulating layer 304 is formed so as to flatten the roughness caused by the formation of the thin film transistor 303.

The substrate 301 may be a glass substrate, a quartz substrate, a flexible substrate (bendable substrate formed of polyimide, polyethyleneterephthalate, polyethylenenaphthalate, etc.) or the like. In the case where the substrate 301 does not need to be light-transmissive, the substrate 301 may be a metal substrate, a ceramic substrate, a semiconductor substrate or the like.

The underlying layer 302 may typically be formed of a silicon oxide-based insulating film, a silicon nitride-based insulating film, or have a stack structure including a silicon oxide-based insulating film and a silicon nitride-based insulating film. The underlying layer 302 has a function of preventing entrance of a contaminant from the substrate 301 or alleviating the stress generated by expansion or contraction of the substrate 301.

The thin film transistor 303 is a top gate TFT in this embodiment, but may be an inversely staggered TFT. Instead of a three-terminal element such as a thin film transistor or the like, a two-terminal element acting as a switching element may be used.

The first insulating layer 304 may be formed by applying a resin material such as polyimide, acrylic resin or the like and then curing the resin material.

The first insulating layer 304 may have a thickness that is sufficient to flatten the roughness caused by the formation of the thin film transistor 303. The thickness of the first insulating layer 304 is typically 1 to 3 µm, but is not limited to such a range.

Next, as shown in FIG. 4B, the contact hole reaching the thin film transistor 303 is formed in the first insulating layer 304, and then the pixel electrode 305 is formed by a known method. In this embodiment, a stack-structure layer including an ITO (Indium Tin Oxide) film and an aluminum film is formed by a known sputtering method, and then the stack-structure layer is patterned by a known photolithography method to form the pixel electrode 305. Each such pixel electrode 305 is located in correspondence with the respective pixel among the plurality of pixels.

Next, as shown in FIG. 5A, the first EL common layer 306 is formed. In this embodiment, a stack of functional layers, specifically, a hole injection layer and a hole transfer layer, is formed as the first EL common layer 306. The specific materials usable for the first EL common layer 306 are as described above. The thickness of each of the functional layers may be appropriately determined from a range with which each layer acts as the hole injection layer or the hole transfer layer.

In this embodiment, the first EL common layer 306 is formed by the liquid droplet ejection method of the electrostatic system. A known representative liquid droplet ejection method is an inkjet method. According to the liquid droplet ejection method of the electrostatic system, a solvent containing a necessary material dispersed therein is dropped onto the substrate, so that a necessary thin film is formed locally. With this technique, a thin film is formed locally by highly precise positional alignment, and thus a microscopic film is formed with no use of photolithography.

With the liquid droplet ejection method of the electrostatic system used in this embodiment, very tiny liquid droplets are ejected from nozzles. Typically, liquid droplets in the range of 0.1 fl (femtoliters) to 1.0 pl (picoliters) are ejected with a positional alignment precision of about 0.2 µm. The liquid droplet ejection method of the electrostatic system is a known technology. In this embodiment, a liquid droplet ejection device including a plurality of nozzles for liquid droplet ejection so as to eject liquid droplets toward many pixels at the same time is used.

In the case where the liquid droplet ejection method of the electrostatic system is used, the ejected liquid droplets are extremely small. Therefore, in the case where an organic material used to form the first EL common layer 306 is ejected as being dispersed in an organic solvent as in this embodiment, only the solvent is mostly evaporated before the liquid droplets reach the pixel electrode 305. Namely, the organic material used for the first EL common layer 306 is in a substantially solid state when being attached to the pixel electrode 305. Therefore, the first EL common layer 306 is formed only in a target area with no need to form a wall such as a conventional bank or the like.

Specifically, in this embodiment, the organic material used for the first EL common layer 306 is dispersed in a solvent, and the liquid droplets thereof are ejected toward the main surface and the end of the pixel electrode 305 by the liquid droplet ejection method of the electrostatic system. Thus, the first EL common layer 306 is formed. The thickness of the first EL common layer 306 is easily controllable by adjusting the amount of the liquid to be dropped or the number of times of dropping. Thus, the local control on the thickness is easily realized.

The first EL common layer 306 may be formed to a desired thickness at the end of the pixel electrode 305 by selectively increasing the amount of the liquid to be dropped or the number of times of dropping. Thus, occurrence of shortcircuiting between the pixel electrode 305 and the common electrode 309 is prevented by the EL common layer 306 with no use of an additional component such as a bank or the like.

The pixel electrode 305 has a recessed portion caused by the formation of the contact hole in which the pixel electrode 305 and the thin film transistor 303 are connected with each other. In this embodiment, the liquid droplets may be ejected toward the recessed portion in a concentrated manner, so that the recessed portion is filled with the first EL common layer 306. Thus, the main surface of the pixel electrode 305 having the recessed portion is flattened by the first EL common layer 306.

In this embodiment, the use of the liquid droplet ejection method makes the conventional bank structure unnecessary. Therefore, various steps required to form the bank (resin application step, resin curing step, patterning step, etc.) are omitted. In addition, a baking step of evaporating the solvent after the formation of the first EL common layer 306 is also omitted. As a result, the number of steps for producing the organic EL display device 100 is significantly decreased.

Next, as shown in FIG. 5B, the light emitting layer 307 is formed on the first EL common layer 306. In this embodiment, the light emitting layer 307 is also formed by the liquid droplet injection method of the electrostatic system. Thus, the light emitting layer 307 is formed selectively at a desired position with no need to form a bank. Alternatively, a known vapor deposition method may be used as long as a vapor deposition mask is positionally aligned with high precision. The specific organic materials usable for the light emitting layer 307 are as described above.

Next, as shown in FIG. 6A, the second EL common layer 308 is commonly formed for a plurality of pixels. In this embodiment, a stack-structure layer including functional layers, specifically, an electron hole injection layer and an electron transfer layer, is formed as the second EL common layer 308. The specific materials usable for the second EL common layer 308 are as described above. The thickness of each of the functional layers may be appropriately determined from a range with which each layer acts as the electron injection layer or the electron transfer layer.

In this embodiment, the second EL common layer 308 is also formed by the liquid droplet injection method of the electrostatic system. Thus, it is guaranteed that the second EL common layer 308, which is formed so as to completely cover the first EL common layer 306 and the light emitting layer 307, has a sufficient thickness at an end of each of the layers. In the case where improvement in the production throughput is prioritized, the second EL common layer 308 may be formed by a known vapor deposition method. Alternatively, the formation of the second EL common layer 308 may be omitted.

Next, as shown in FIG. 6B, the common electrode 309 acting as the cathode of the organic EL element, and the second insulating layer 310 acting as the sealing film, are formed. The specific materials usable for each of the common electrode 309 and the second insulating layer 310 are as described above.

In this embodiment, the common electrode 309 and the second insulating layer 310 are continuously formed by a known sputtering method, without being exposed to the atmosphere. A metal material used for the common electrode 309, for example, an MgAg alloy, has a low work function but is easily oxidized. Therefore, it is desirable that the second insulating layer 310 is formed after the common electrode 309 is formed, without exposing the common electrode 309 to oxygen.

Next, as shown in FIG. 7A, the black mask 311 is formed above the thin film transistor 303. In this embodiment, the black mask 311 is formed by a resin material containing carbon black. Specifically, a resin material containing carbon black is dispersed in a solvent and is applied selectively above the thin film transistor 303 by the above-described liquid droplet ejection method of the electrostatic system. Such a formation of the black mask 311 requires none of the resin application step, the resin curing step and the patterning step, which are required by a conventional method. Thus, the production process of the organic EL display device 100 is simplified.

Needless to say, the black mask 311 may be formed by a known method. For example, the black mask 311 may be formed by, for example, patterning a metal film such as a chromium film or the like, or patterning a resin layer containing carbon black.

Next, as shown in FIG. 7B, the third insulating layer 312 is formed as the protective layer. In this embodiment, a resin layer of polyimide, acrylic resin or the like is formed as the third insulating layer 312 by a printing method. With the printing method, the resin layer is allowed to be formed selectively. Thus, the third insulating layer 312 is allowed to be formed so as to avoid a connection terminal provided in a peripheral area of the organic EL display device 100.

With the above-described steps, the organic EL display device 100 in embodiment 1 described above with reference to FIG. 3 is produced. In this embodiment, the first EL common layer 306 is formed by the liquid droplet ejection method of the electrostatic system. Therefore, the first EL common layer 306 with a sufficient thickness covers the end of the pixel electrode 305 with no use of a bank structure. As a result, shortcircuiting between the pixel electrode 305 and the common electrode 309 is prevented from occurring at the end of the pixel electrode 305.

The amount of the liquid to be dropped or the number of times of dropping may be controlled to selectively apply an organic material to form the first EL common layer 306. Therefore, the recessed portion formed at the main surface of the pixel electrode 305 may be filled with the first EL common layer 306 formed of an organic material so as to provide a flat surface.

(Embodiment 2)

FIG. 8 is a cross-sectional view showing a schematic structure of an organic EL display device 200 in embodiment 2 according to the present invention. Unlike in the organic EL display device 100 in embodiment 1, in the organic EL display device 200 in embodiment 2, the black mask 311 is provided between the common electrode 309 and the second insulating layer 310. Except for this, the organic EL display device 200 is the same as the organic EL display device 100 in embodiment 1.

In this embodiment, after the common electrode 309 is formed, the black mask 311 is formed by the liquid droplet ejection method of the electrostatic system in a nitrogen atmosphere. Then, the substrate 301 and the components formed thereon including the common electrode 309 and the black mask 311 are put into a sputtering device, and the second insulating layer 310 is formed.

In the organic EL display device 200 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 200 in this embodiment provides substantially the same effects as those described regarding the organic EL display device 100 in embodiment 1. In addition, since the black mask 311 is closer to the light emitting layer 307 than in the organic EL display device 100 in embodiment 1, the amount of light leaking to an adjacent pixel is decreased.

(Embodiment 3)

FIG. 9 is a cross-sectional view showing a schematic structure of an organic EL display device 300 in embodiment 3 according to the present invention. Unlike in the organic EL display device 100 in embodiment 1, in the organic EL display device 300 in embodiment 3, the black mask 311 is provided between the second EL common layer 308 and the common electrode 309. Except for this, the organic EL display device 300 is the same as the organic EL display device 100 in embodiment 1.

In this embodiment, the black mask 311 is formed by the liquid droplet ejection method of the electrostatic system so as to be in contact with the second EL common layer 308. Therefore, it is preferable to use a solvent having no influence on the second EL common layer 308 (e.g., a fluorocarbon-based solvent such as fluoroether or the like) as a solvent for the liquid droplet ejection method (as a solvent in which the resin material containing carbon black is dispersed).

In the case where the second EL common layer 308 is not formed, the black mask 311 is formed in contact with the first EL common layer 306 or the light emitting layer 307. In this case also, it is preferable to use a solvent having no influence on the first EL common layer 306 or the light emitting layer 307 (e.g., a fluorocarbon-based solvent such as fluoroether or the like).

In the organic EL display device 300 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 300 in this embodiment provides substantially the same effects as those described regarding the organic EL display device 100 in embodiment 1.

Since the black mask 311 is provided between the end of the pixel electrode 305 and the common electrode 309, the black mask 311 is present above the end of the pixel electrode 305. Therefore, the end of the pixel electrode 305, in which an electric field is easily disturbed and on which the first EL common layer 306 and the light emitting layer 307 are likely to be non-uniform, is concealed, and occurrence of shortcircuiting between the pixel electrode 305 and the common electrode 309 is prevented more effectively. In order to provide these effects, it is preferable to use a highly insulating material for the black mask 311. In addition, in the organic EL display device 300 in this embodiment, the black mask 311 is closer to the light emitting layer 307 than in the organic EL display device 100 in embodiment 1. Therefore, the amount of light leaking to an adjacent pixel is decreased.

(Embodiment 4)

Figure 10:
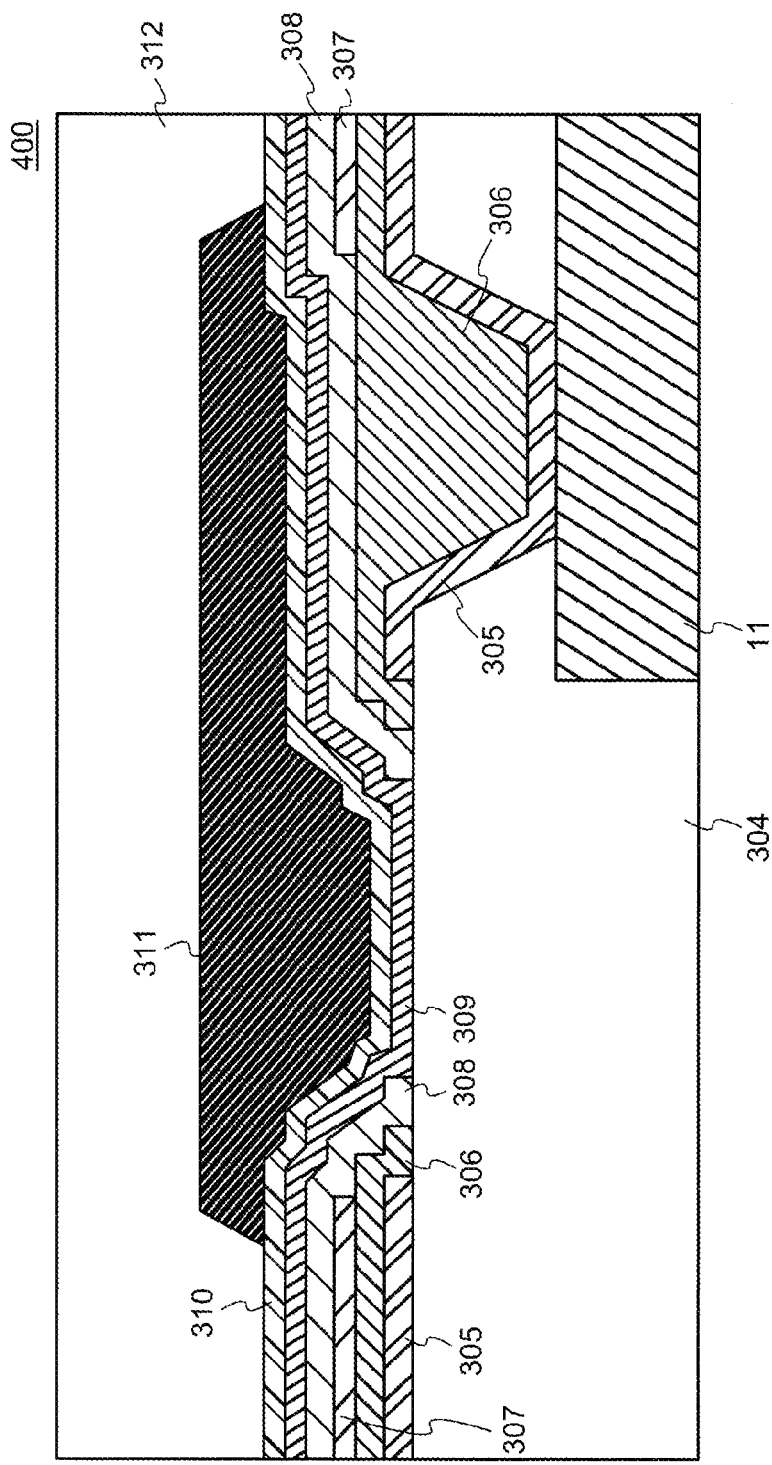
FIG. 10 is a cross-sectional view showing a schematic structure of a pixel portion of an organic EL display device in embodiment 4 according to the present invention.

FIG. 10 is a cross-sectional view showing a schematic structure of an organic EL display device 400 in embodiment 4 according to the present invention. Unlike in the organic EL display device 100 in embodiment 1, in the organic EL display device 400 in embodiment 4, the second EL common layer 308 is separately provided for each of the pixels, like the first EL common layer 306 and the light emitting layer 307. Except for this, the organic EL display device 400 is the same as the organic EL display device 100 in embodiment 1.

As shown in FIG. 10, the pixel electrode 305 is formed on an electrode acting as a part of the thin film transistor 303 (e.g., drain electrode) 11 via the contact hole. The recessed portion formed at the main surface of the pixel electrode 305 (portion recessed by the contact hole) is filled with the first electrode common layer 306. This structure is not limited to embodiment 4, and is common to embodiments 1 through 3 described above and also to embodiment described below.

In this embodiment, the second EL common layer 308 is formed selectively for each of the pixels by the liquid droplet ejection method of the electrostatic system. Specifically, as shown in FIG. 10, the second EL common layer 308 is formed so as to cover an end of the first EL common layer 306, and is separately provided for each of pixels. In other words, none of the first EL common layer 306, the light emitting layer 307 and the second EL common layer 308, which are formed of an organic material, is commonly formed for a plurality of pixels. As a result, carriers are not moved between the pixels via such a layer formed of an organic material, and thus the magnitude of leak current between the pixels is decreased.

As described above, none of the first EL common layer 306, the light emitting layer 307 and the second EL common layer 308, which are formed of an organic material, is provided between the pixels. Therefore, the common electrode 309 and the first insulating layer 304 are in contact with each other between the pixels. This is a feature of the organic EL display device 400 in this embodiment.

The second insulating layer 308 covers the end of the first insulating layer 306. Therefore, the end of the pixel electrode 305, the end of the first EL common layer 306, and an end of the second EL common layer 308 are located in this order outward (toward an adjacent pixel) as seen from the pixel electrode 305. As seen in a plan view, the pixel electrode 305 is located to overlap the entirety of the light emitting layer 307, the first EL common layer 306 is located to overlap the entirety of the pixel electrode 305, and the second EL common layer 308 is located to overlap the entirety of the first EL common layer 306. This is also a feature of the organic EL display device 400 in this embodiment.

As shown in FIG. 10, the light emitting layer 307 is not provided above the contact hole in which the drain electrode 11 and the pixel electrode 305 are connected with each other. A reason for this is that if the light emitting layer 307 is located just above the contact hole, a part of the light emitting layer 307 that is just above the contact hole is difficult to be controlled regarding light emission because the first EL common layer 306 has a different thickness in the contact hole from in the remaining portion thereof.

In the organic EL display device 400 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 400 in this embodiment provides substantially the same effects as those described regarding the organic EL display device 100 in embodiment 1.

In addition, as described above, the first EL common electrode 306, the light emitting layer 307 and the second EL common layer 308 are provided for each of the pixels, and do not present between the pixels. Therefore, the magnitude of leak current, caused by carriers moving between the pixels, is decreased.

(Embodiment 5)

Figure 11:
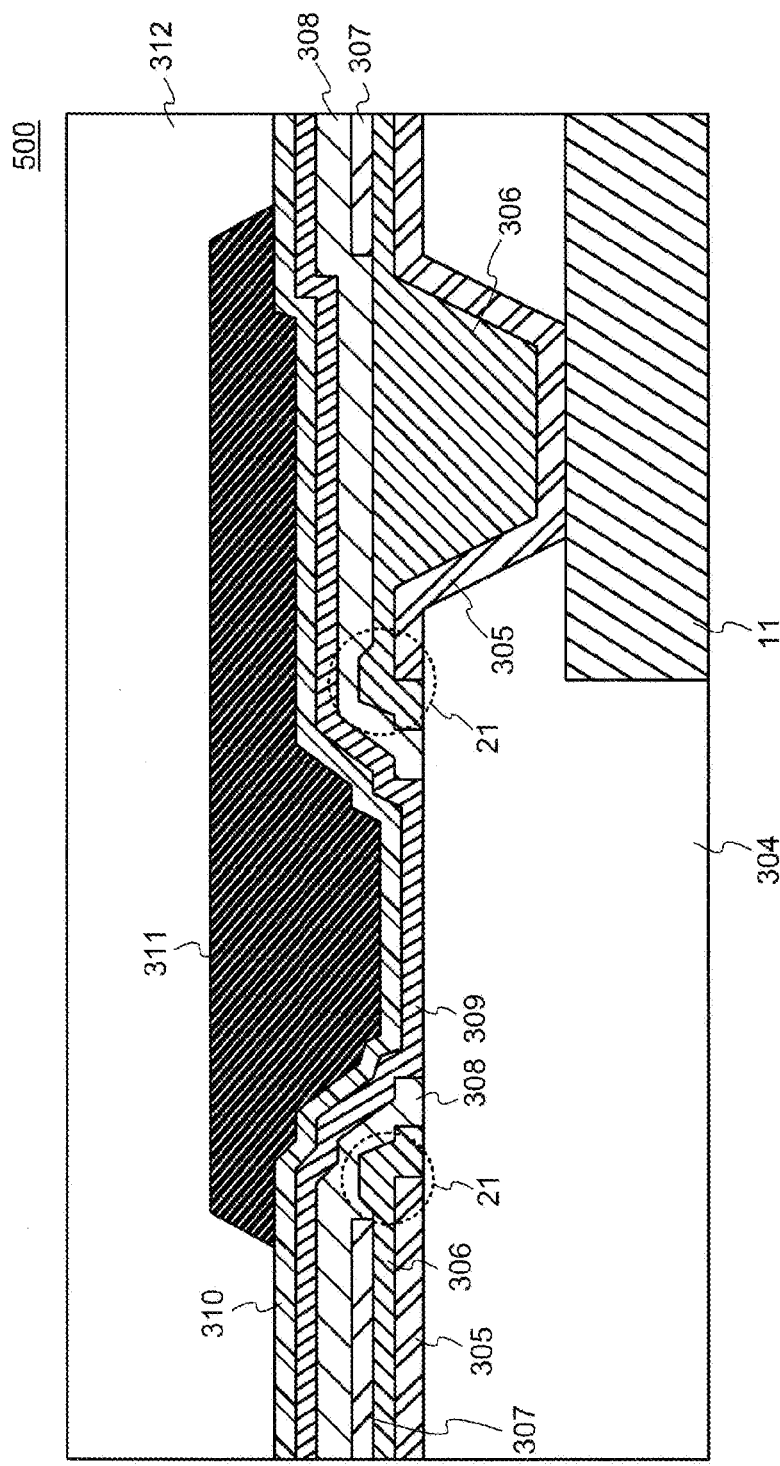
FIG. 11 is a cross-sectional view showing a schematic structure of a pixel portion of an organic EL display device in embodiment 5 according to the present invention.

FIG. 11 is a cross-sectional view showing a schematic structure of an organic EL display device 500 in embodiment 5 according to the present invention. Unlike in the organic EL display device 100 in embodiment 1, in the organic EL display device 500 in embodiment 5, the second EL common layer 308 is separately provided for each of the pixels (like in embodiment 4), and the first EL common layer 306 has a larger thickness locally, more specifically, in a portion thereof on the end of the pixel electrode 305, than in the remaining portion thereof. Except for these, the organic EL display device 500 is the same as the organic EL display device 100 in embodiment 1.

In the organic EL display device 500 in this embodiment, the thickness of the first EL common layer 306 is larger locally, more specifically, in the portion on the end of the pixel electrode 305, than the thickness of the remaining portion as represented by dotted circles 21. This prevents occurrence of shortcircuiting between the pixel electrode 305 and the common electrode 309 more effectively at the end of the pixel electrode 305.

In this embodiment, the first EL common layer 306 is formed by the liquid droplet ejection method of the electrostatic system, and therefore, is easily controlled regarding the thickness. Therefore, in this embodiment, the organic material used for the first EL common layer 306 is attached to the end of the pixel electrode 305 in a concentrated manner, so that the thickness of the portion of the first EL common layer 306 that is on the end of the pixel electrode 305 is made larger than the thickness of the remaining portion of the first EL common layer 306. This may be realized by increasing the amount of the liquid to be dropped or the number of times of dropping toward the end of the pixel electrode 305.

In the organic EL display device 500 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 500 in this embodiment provides substantially the same effects as those described regarding the organic EL display device 100 in embodiment 1.

As described above, the thickness of the portion of the first EL common layer 306 that is on the end of the pixel electrode 305 is larger than the thickness of the remaining portion of the first EL common layer 306. This prevents occurrence of shortcircuiting between the pixel electrode 305 and the common electrode 309 more effectively.

(Embodiment 6)

Figure 12:
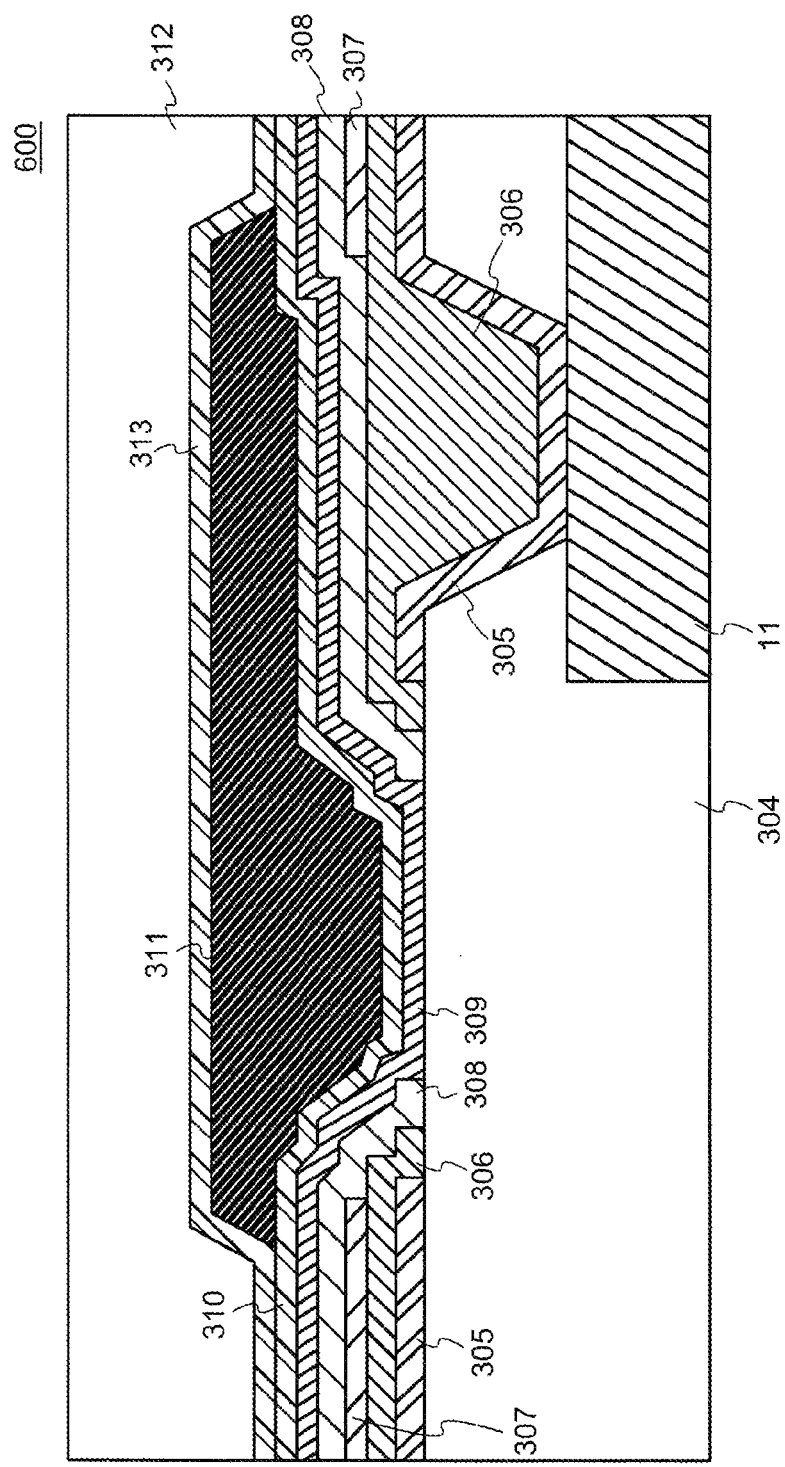
FIG. 12 is a cross-sectional view showing a schematic structure of a pixel portion of an organic EL display device in embodiment 6 according to the present invention.

FIG. 12 is a cross-sectional view showing a schematic structure of an organic EL display device 600 in embodiment 6 according to the present invention. Unlike in the organic EL display device 100 in embodiment 1, in the organic EL display device 600 in embodiment 6, the second EL common layer 308 is separately provided for each of the pixels (like in embodiment 4), and the black mask 311 is held between the second insulating layer 310 and a fourth insulating layer 313. Except for these, the organic EL display device 600 is the same as the organic EL display device 100 in embodiment 1.

In this embodiment, after the black mask 311 is formed by the same method as in embodiment 1, the fourth insulating layer 313 is formed by a sputtering method or the like. As a result, the black mask 311 is held between the second insulating layer 310 and the fourth insulating layer 313 in the organic EL display device 600 in this embodiment. With such a structure, even when a foreign substance or the like is present on the second insulating layer 310, the fourth insulating layer 313 is formed while being less influenced by the foreign substance. Therefore, the function of each of the second insulating layer 310 and the fourth insulating layer 313 as a sealing film is increased, and thus the reliability of the organic EL display device 600 is improved.

In this embodiment, the black mask 311 is formed by a spin-coating method. More specifically, a resin material containing carbon black is applied in a liquid state or a gel state by a spin-coating method, is cured by light, and then is patterned. Thus, the black mask 311 is formed. For the pattering, the characteristic of the liquid or gel substance of gathering to a stepped portion (recessed or protruding portion) is utilized. In the case where the thickness of the black mask 311 is to be controlled precisely, the black mask 311 may be formed of a vapor deposition method.

In the case where, for example, the second insulating layer 310 has a stepped portion caused by another component (e.g., the pixel electrode 305 or the light emitting layer 307) or in the case where, for example, there is a stepped portion caused by a foreign substance present on the second insulating layer 310, a spin-coated solution containing the resin material gathers to the stepped portion. Therefore, when the solution containing the resin material containing carbon black is spin-coated to form the black mask 311, such a stepped portion, even if being present, is flattened. In this manner, the fourth insulating layer 313 is formed with less influence of the stepped portion of the second EL insulating layer 310. The resultant fourth insulating layer 313 as the sealing film has a higher reliability.

In the organic EL display device 600 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 600 in this embodiment provides substantially the same effects as those described regarding the organic EL display device 100 in embodiment 1.

As described above, the fourth insulating layer 313 as the sealing film is provided with less influence of the stepped portion of the second EL insulating layer 310. Therefore, the reliability of the organic EL display device 600 is improved.
(Embodiment 7)

Figure 13:
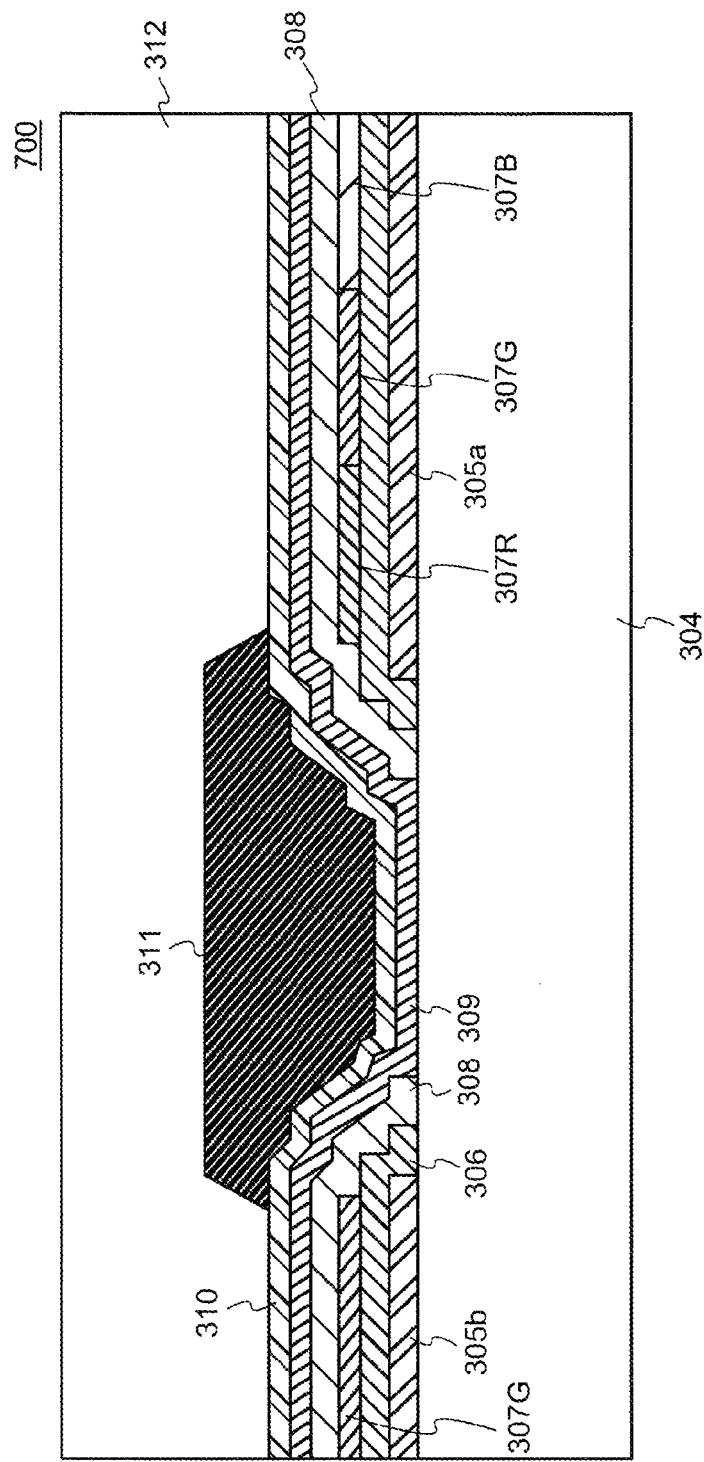
FIG. 13 is a cross-sectional view showing a schematic structure of a pixel portion of an organic EL display device in embodiment 7 according to the present invention.

FIG. 13 is a cross-sectional view showing a schematic structure of an organic EL display device 700 in embodiment 7 according to the present invention.

Unlike in the organic EL display device 100 in embodiment 1, in the organic EL display device 700 in embodiment 7, the second EL common layer 308 is separately provided for each of the pixels (like in embodiment 4), and light emitting layers corresponding to the RGB colors are provided on one, same pixel electrode. Except for these, the organic EL display device 700 is the same as the organic EL display device 100 in embodiment 1.

As shown in FIG. 13, a light emitting layer 307R emitting red light, a light emitting 308G emitting green light, and a light emitting 308G emitting blue light are provided on a pixel electrode 305a. On a pixel electrode 305b, only the light emitting layer 307G emitting green light is provided. Alternatively, a light emitting layer that emits light of another color may be provided on the pixel electrode 305b.

In this embodiment, the light emitting layer 307 is formed by the liquid droplet ejection method of the electrostatic system. Therefore, the light emitting layers emitting light of different colors may be formed at a precision of about 0.2 µm. The light emitting layers 307R, 307G and 307B corresponding to different colors are allowed to be formed on one pixel electrode 305a, with no use of the bank structure as required conventionally. The light emitting layer 307R, the light emitting layer 307G and the light emitting layer 307B on the pixel electrode 305a may be turned on at the same time, so that sub pixels respectively including these light emitting layers act together as a sub pixel corresponding to white (W). Namely, the sub pixels respectively including the light emitting layer 307R, the light emitting layer 307G and the light emitting layer 307B each act as a sub pixel corresponding to the respective color among the RGB colors, and act together as a sub pixel providing white light.

The organic EL display device 700 in this embodiment includes sub pixels each corresponding to one of the RGB colors and also a sub pixel corresponding to white, so that the color purity is finely adjusted and smooth display of an image is realized.

The sub pixels may be arranged in any of various patterns. Such arrangement patterns will be described with reference to FIG. 14A through FIG. 14D. FIG. 14A through FIG. 14D are each a plan view showing a schematic structure of the pixel portion of the organic EL display device 700 in this embodiment.

In FIG. 14A, reference sign 41 and reference sign 44R each represent a sub pixel corresponding to R (red). Reference sign 42 and reference sign 44G each represent a sub pixel corresponding to G (green). Reference sign 43 and reference sign 44B each represent a sub pixel corresponding to B (blue). The sub pixels 44R, 44G and 44B are each a sub pixel described above with reference to FIG. 13, and are all provided on one, same pixel electrode. The sub pixels 44R, 44G and 44B may be used together as a sub pixel corresponding to W (white). The sub pixels corresponding to the RGBW colors are used to determine the color of light to be provided by one pixel.

FIG. 14B shows a pattern that is basically the same as the pattern shown in FIG. 14A, except that the locations of the sub pixels 44R, 44G and 44G are different.

Figure 14D:
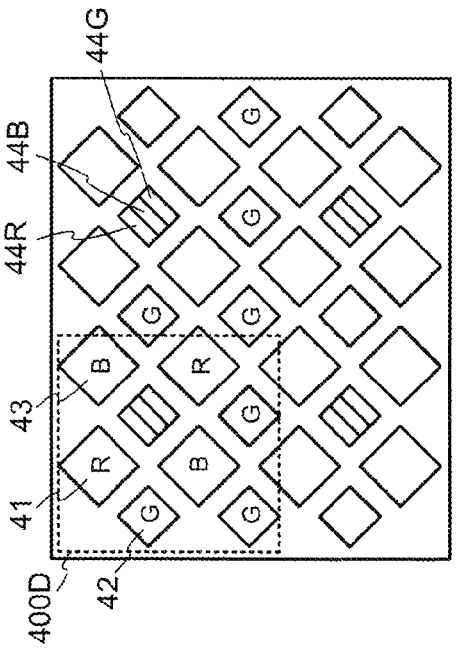
FIG. 14D is a plan view showing a schematic structure of the pixel portion of the organic EL display device in embodiment 7 according to the present invention.
Figure 14C:
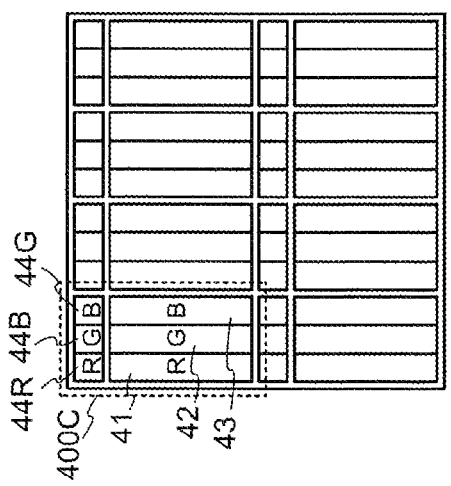
FIG. 14C is a plan view showing a schematic structure of the pixel portion of the organic EL display device in embodiment 7 according to the present invention.

FIG. 14C shows a pattern in which the sub pixels 41 through 43 are located in stripes and a top part thereof is separated from the rest and includes the sub pixels 44R, 44G and 44B. In this case also, the sub pixels 44R, 44G and 44B act together as a sub pixel corresponding to W (white).

FIG. 14D shows an example in which the sub pixels 44R, 44G and 44B in this embodiment are added to a so-called diamond pen tile arrangement. In this case also, the sub pixels 44R, 44G and 44B act together as a sub pixel corresponding to W (white).

The pixel structure in this embodiment is applicable to the arrangement patterns shown in FIG. 14A through FIG. 14D, and also to any arrangement pattern using RGBW colors. In FIG. 14A, a region enclosed by a dotted square is one pixel 400A. The pixel 400A includes one of each of the sub pixels 41 through 43, 44R, 44G and 44B. In FIG. 14B, a region enclosed by a dotted square is one pixel 400B. The pixel 400B includes one of each of the sub pixels 41 through 43, 44R, 44G and 44B. In FIG. 14C, a region enclosed by a dotted square is one pixel 400C. The pixel 400C includes one of each of the sub pixels 41 through 43, 44R, 44G and 44B. In FIG. 14D, a region enclosed by a dotted square is one pixel 400D. The pixel 400D includes two sub pixels 41, two sub pixels 43, three sub pixels 42, and one of each of sub pixels 44R, 44G and 44B.

In this embodiment, light emitting layers respectively corresponding to the RGB colors are provided on one, same pixel electrode to provide white light. Alternatively, for example, light emitting layers respectively corresponding to the R and G colors may be provided on one, same pixel electrode to provide yellow light. Such an arrangement is applicable to any pattern using the RGBY colors.

In this manner, necessary light emitting layers may be provided in a desired arrangement on one, same pixel electrode so as to provide light of a desired color.

In the example shown in FIG. 13, the light emitting layers 307R, 307G and 307B are shown as having the same thickness. Alternatively, the thickness of at least one of the light emitting layers may be different from the thickness of the other light emitting layers. For example, the light emitting layer 307B corresponding to B may be thinner than each of the light emitting layers 307R and 307G corresponding to R and G. The thickness of the light emitting layers may be easily controlled by the amount of liquid to be dropped or the number of times of dropping in the liquid droplet ejection method as described above.

In this manner, the thickness of each of the light emitting layers 307R, 307G and 307B may be controlled in each pixel or among different pixels, so as to provide a microcavity effect. Thus, the luminance and the color purity of the organic EL display device 700 are improved.

In the organic EL display device 700 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 700 in this embodiment provides substantially the same effects as those described regarding the organic EL display device 100 in embodiment 1.

In addition, as described above, light emitting layers corresponding to different colors are provided on one, same pixel electrode. Therefore, a sub pixel corresponding to white is provided with no increase in the number of the production steps. Thus, the organic EL display device 700 are improved in the luminance and the color purity and realizes smooth display of an image with no increase in the number of the production steps.

(Embodiment 8)

FIG. 15A and FIG. 15B are each a cross-sectional view showing a schematic structure of an organic EL display device 800 in embodiment 8 according to the present invention. Unlike in the organic EL display device 100 in embodiment 1, in the organic EL display device 800 in embodiment 8, the second EL common layer 308 is separately provided for each of the pixels (like in embodiment 4), and a transparent resin material is applied after the second insulating layer 308 is formed. Except for these, the organic EL display device 800 is the same as the organic EL display device 100 in embodiment 1.

In the structure shown in FIG. 15A, after the second insulating layer 310 is formed, a transparent resin layer (e.g., layer formed of a light-transmissive acrylic resin material) is formed by a spin-coating method (solution application method) or a vapor deposition method. In this example, it is not an aim to form a thin film of a transparent resin. Therefore, after the solution is dropped, the substrate may be spun to be deprived of the solution. Even in this case, a very thin film formed of a transparent resin material is adsorbed to the second insulating layer 310. The layer formed of the transparent resin material has a thickness of 10 to 50 nm.

The applied solution has a characteristic of gathering to a stepped portion. Therefore, the solution containing the transparent resin material applied to the second insulating layer 310 gathers to a stepped portion. In this case, the "stepped portion" may be caused by a surface of the second insulating layer 310 having roughness, or may be caused by a foreign substance present on the second insulating layer 310. The solution gathering to the stepped portion remains after the spinning step.

In the case of FIG. 15A, the second insulating layer 310 includes stepped portions (enclosed by the dotted circles) caused by the pixel electrode 305, the first EL common layer 306, the second EL common layer 308 and the light emitting layer 307 provided below the second insulating layer 310. Therefore, the applied solution containing the transparent resin material gathers to the stepped portions. The transparent resin material is cured by light or the like, so that a transparent resin 51 is selectively left on the stepped portions. Namely, the second insulating layer 310 having the stepped portions is flattened with the transparent resin 51.

As described above, in this embodiment, the second insulating layer 310 having the stepped portions is flattened with the transparent resin 51 before the fourth insulating layer 313 is formed. This decreases the possibility that the fourth insulating layer 313 has a pin hole or is delaminated. Even if the second insulating layer 310 has a pin hole or the like, such a pin hole or the like is covered with the fourth insulating layer 313. This is expected to provide a further sealing effect. Therefore, the organic EL display device 800 effectively prevents entrance of moisture or a contaminant from outside and thus is highly reliable.

In the case of FIG. 15B, the second insulating layer 310 having stepped portions is flattened by the transparent resin 51, and then the black mask 311 is formed. The fourth insulating layer 311 is formed on the black mask 311, so that the black mask 311 is held between the second insulating layer 310 and the fourth insulating layer 313.

Figure 16:
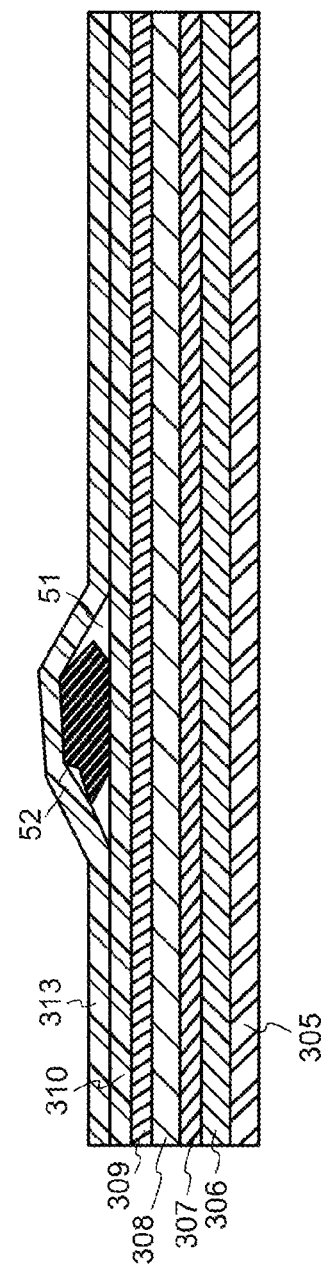
FIG. 16 is a cross-sectional view showing a schematic structure of a pixel (foreign substance and the vicinity thereof) of the organic EL display device in embodiment 8 according to the present invention.

In the structure shown in each of FIG. 15A and FIG. 15B, in the case where a foreign substance 52 is present on the second insulating layer 310, the transparent resin 51 is formed around the foreign substance 52 as shown in FIG. 16, and thus a stepped portion caused by the foreign substance 52 is alleviated. Therefore, even if the fourth insulating layer 313 is formed on the foreign substance 52, the fourth insulating layer 313 is not disrupted on top of the foreign substance 52. The fourth insulating layer 313 is formed with no influence of the foreign substance 52 and acts as a highly reliable sealing film. The reliability of the organic EL display device 800 is improved.

In the organic EL display device 800 in this embodiment, like in the organic EL display device 100 in embodiment 1, the main surface and the end of the pixel electrode 305 are covered with the first EL common layer 306 formed by the liquid droplet ejection method of the electrostatic system. Therefore, the organic EL display device 800 in this embodiment provides substantially the same effects as those described regarding the organic EL display device 100 in embodiment 1.

Even in the case where the transparent resin 51 is not used, the black mask 311 remains around the foreign substance 52 in a shape similar to that of the transparent resin 51. Therefore, a highly reliable sealing film is formed with no influence of the foreign substance 52. Such a structure shown in FIG. 15B is desirably adopted when a highly reliable device especially against the foreign substance 52 is needed. A reason for this is that both of the transparent resin 51 and the black mask 311 are attached around the foreign substance 52, and thus the foreign substance 52 is more easily enclosed. The structure shown in FIG. 15A is effective to prevent the light emitting layer 307 from being damaged, during the step of forming the black mask 311, by entrance of moisture or the like via a pin hole or the like formed in the second insulating layer 310.

As described above, the step of applying the solution containing the transparent resin material is performed is added after the step of forming the second insulating layer 310. Thus, the stepped portion caused to the second insulating layer 310 or the stepped portion caused by foreign substance present on the second insulating layer 310 is alleviated. The fourth insulating layer 313 formed on the second insulating layer 310 is not provided with a pin hole, is not delaminated or is not ruptured. Therefore, the organic EL display device 800 has a sealing structure with higher reliability.

(Embodiment 9)

Figure 17:
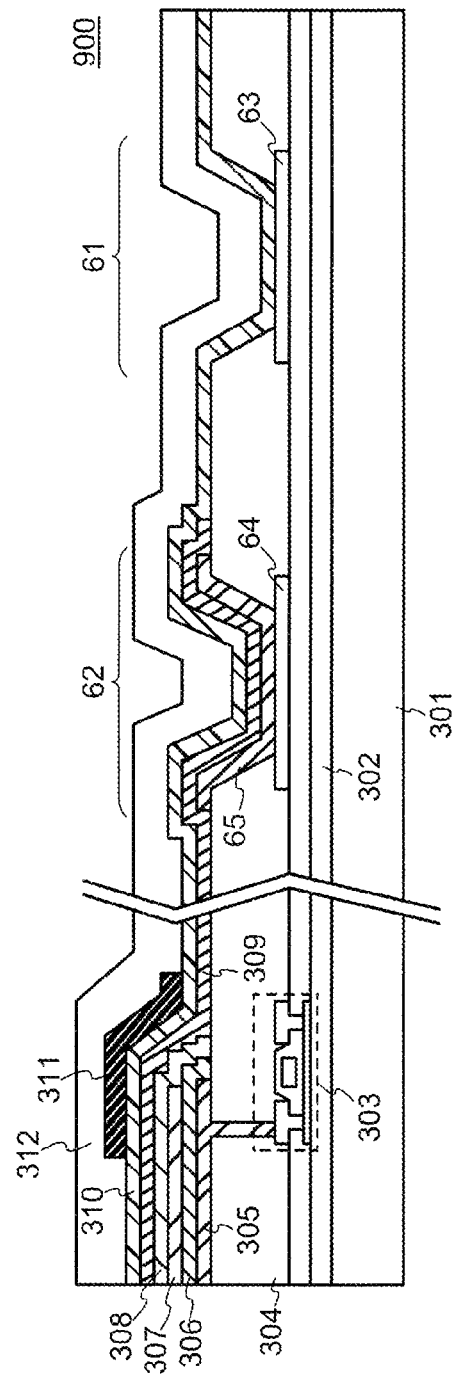
FIG. 17 is a cross-sectional view showing a schematic structure outside a pixel portion of an organic EL display device in embodiment 9 according to the present invention.

FIG. 17 is a cross-sectional view showing a schematic structure of an organic EL display device 900 in embodiment 9 according to the present invention. Unlike the organic EL display device 100 in embodiment 1, the organic EL display device 900 includes a moisture block structure provided outer to the pixel portion 102 (on the side of the end of the substrate) in order to prevent entrance of moisture from outside. Except for this, the organic EL display device 900 is the same as the organic EL display device 100 in embodiment 1.

As shown in FIG. 17, a moisture block structure 61 and a cathode contact portion 62 are provided outer to the pixel portion 102. The moisture block structure 61 is provided for the purpose of preventing entrance of moisture from outside. Basically, an opening is formed in a part of the first insulating layer 304, and the opening is filled with the second insulating layer 310 and the third insulating layer 312.

In this embodiment, a conductive layer 63 formed at the same time as source/drain electrodes of the thin film transistor 303 is used as an etching stopper for formation of the opening in the first insulating layer 304. Needless to say, the etching stopper is not limited to this, and may be a conductive layer formed at the same time as a gate electrode of the thin film transistor 303 or a semiconductor layer formed at the same time as an active layer of the thin film transistor 303.

The moisture block structure 61 significantly decreases the possibility that moisture enters from outside via an interface between the stacked insulating layers and conductive layers. Thus, the reliability of the organic EL display device 900 is improved.

The cathode contact portion 62 electrically connects the cathode 309 and a line 64 with each other. The line 64 is formed of the same material as that of the source/drain electrodes of the thin film transistor 303, and transmits a common voltage to the cathode 309. The line 64 also acts as an etching stopper for formation of the opening in the first insulating layer 304. Needless to say, the line 64 may be formed of the same material as that of the gate electrode of the thin film transistor 303.

In this embodiment, after the opening is formed in the first insulating layer 304, a pad electrode 65 is formed of the same material as that of the pixel electrode 305, so that the cathode 309 and the line 64 are electrically connected with each other via the pad electrode 65. Such a structure has an advantage that there is no other conductive layer to be removed from the top of the line 64 and thus a surface of the line 64 is not unnecessarily roughened. Needless to say, the pad electrode 65 may be omitted (namely, the conductive layer formed on the line 64 may be removed), so that the line 64 and the cathode 309 are directly connected with each other.

In the organic EL display device 900 in this embodiment described above, the cathode contact portion 62 is provided in addition to the moisture block structure 61. The cathode contact portion 62 may be omitted.

As described above, the organic EL display device 900 in this embodiment includes the structure preventing entrance of moisture (moisture block structure 61) provided outer to the pixel portion 102. The organic EL display device 900 has an effect of being highly reliable in addition to the effects provided by the organic EL display device 100 in embodiment 1.

The above-described embodiments according to the present invention may be combined optionally as long as not contradicting each other. The devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in a condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being provided by the present invention.

The invention claimed is:
1. An organic EL display device, comprising:
a plurality of pixels;
wherein:
the plurality of pixels each include a light emitting element;
the light emitting element includes a pixel electrode, a common electrode, an EL common layer, and a light emitting layer;
the EL common layer and the light emitting layer are provided between the pixel electrode and the common electrode;
the EL common layer covers a main surface and an end of the pixel electrode;
the pixel electrode is provided on an insulating layer; and
a bottom surface of the common electrode is in contact with an upper surface of the insulating layer between the plurality of pixels.

2. The organic EL display device according to claim 1, wherein:
the EL common layer has a first portion and a second portion;
a first thickness of the first portion directly above the end of the pixel electrode is larger than a second thickness of the second portion directly above the main surface of the pixel electrode; and
the end of the pixel electrode surrounds the main surface of the pixel electrode in a plan view.

3. The organic EL display device according to claim 1, further comprising:
a transistor;
wherein:
the transistor and the pixel electrode are connected with each other via a recessed portion of the pixel electrode formed in a contact hole provided in the insulating layer; and
the recessed portion formed at the main surface of the pixel electrode is filled with the EL common layer.

4. The organic EL display device according to claim 3, wherein:
the EL common layer includes a first EL common layer and a second EL common layer;
the first EL common layer is provided between the pixel electrode and the light emitting layer;
the EL common layer filling the recessed portion is the first EL common layer; and
the second EL common layer is provided between the light emitting layer and the common electrode.

5. The organic EL display device according to claim 4, wherein:
the first EL common layer covers the main surface and the end of the pixel electrode;
the second EL common layer is in contact with, and covers, an end of the light emitting layer and an end of the first EL common layer; and
the second EL common layer directly above the recessed portion is in contact with the first EL common layer.

6. The organic EL display device according to claim 1, wherein the EL common layer and the light emitting layer are each separated into a plurality of portions at a position between the plurality of pixels.

7. The organic EL display device according to claim 1, wherein an end of the light emitting layer is located inner to the end of the pixel electrode.

8. The organic EL display device according to claim 1, wherein:
   the light emitting layer includes three types of light emitting layers each providing light of one of RGB colors; and
   the three types of light emitting layers are provided side by side on one, same pixel electrode as seen in a plan view.

9. The organic EL display device according to claim 8, wherein at least one of the three types of light emitting layers has a thickness different from a thickness of the remaining two types of light emitting layers.

10. A method for producing an organic EL display device including a plurality of pixels, the method comprising:
   forming a pixel electrode at a position corresponding to each of the plurality of pixels on an insulating layer on a substrate;
   forming a stack structure including an EL common layer and a light emitting layer on the pixel electrode; and
   forming a common electrode covering the stack structure and contacting the insulating layer between the plurality of pixels;
   wherein:
   the EL common layer is formed so as to cover a main surface and an end of the pixel electrode; and
   the common electrode is formed such that a bottom surface of the common electrode and an upper surface of the insulating layer are in contact with each other.

11. The method for producing an organic EL display device according to claim 10, wherein:
   the EL common layer is formed such that a first thickness of a first portion directly above the end of the pixel electrode is larger than a second thickness of a second portion directly above the main surface of the pixel electrode; and
   the pixel electrode is formed such that the end of the pixel electrode surrounds the main surface of the pixel electrode in a plan view.

12. The method for producing an organic EL display device according to claim 10, further comprising:
   forming a transistor before forming the pixel electrode; and
   forming a contact hole in the insulating layer to expose a part of the transistor;
   wherein:
   the pixel electrode is formed in the contact hole to have a recessed portion in the contact hole; and
   the recessed portion is filled with the EL common layer.

13. The method for producing an organic EL display device according to claim 12, wherein:
   the formation of the stack structure includes forming a first EL common layer, a second EL common layer and a light emitting layer such that the light emitting layer is held between the first EL common layer and the second EL common layer;
   the first EL common layer is formed to fill the recessed portion; and
   the first EL common layer is formed so as to cover the main surface and the end of the pixel electrode.

14. The method for producing an organic EL display device according to claim 13, wherein:
   the second EL common layer is formed to be in contact with, and to cover, an end of the light emitting layer and an end of the first EL common layer; and
   the second EL common layer is formed to be in contact with the first EL common layer directly above the recessed portion.

15. The method for producing an organic EL display device according to claim 10, wherein the EL common layer and the light emitting layer are each separated into a plurality of portions at a position between the plurality of pixels.

16. The method for producing an organic EL display device according to claim 10, wherein the light emitting layer is formed such that an end thereof is located inner to an end of the pixel electrode.

17. The method for producing an organic EL display device according to claim 10, wherein as the light emitting layer, three type of light emitting layers each providing light of one of RGB colors are formed on one, same pixel electrode side by side as seen in a plan view.

18. The method for producing an organic EL display device according to claim 17, wherein the three types of light emitting layers are formed such that at least one of the three types of light emitting layers has a thickness different from a thickness of the remaining two types of light emitting layers.

19. The method for producing an organic EL display device according to claim 10, wherein the EL common layer and the light emitting layer are formed by a liquid droplet ejection method of an electrostatic system.

* * * * *